US006329247B1

(12) United States Patent
Ito

(10) Patent No.: US 6,329,247 B1
(45) Date of Patent: Dec. 11, 2001

(54) NONVOLATILE SEMICONDUCTOR MEMORY DEVICE AND MANUFACTURING METHOD THEREOF

(75) Inventor: Hiroshi Ito, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/615,704

(22) Filed: Jul. 13, 2000

(30) Foreign Application Priority Data

Aug. 4, 1999 (JP) ..................... 11-221013

(51) Int. Cl.[7] ..................... H01L 21/336

(52) U.S. Cl. ..................... 438/264; 438/257; 438/258; 438/263; 438/265; 438/266; 438/267; 257/315; 257/316; 257/321

(58) Field of Search ..................... 438/257, 258, 438/263–267; 257/315, 321, 316

(56) References Cited

U.S. PATENT DOCUMENTS 5,589,699 * 12/1996 Arki ..................... 257/316
6,232,634 * 5/2001 Wu et al. ..................... 257/316

FOREIGN PATENT DOCUMENTS 61-42171 2/1986 (JP) .
3-9572 1/1991 (JP) .
4-302174 10/1992 (JP) .
8-250610 9/1996 (JP) .
10-313106 11/1998 (JP) .

* cited by examiner

*Primary Examiner*—Charles Bowers
*Assistant Examiner*—Hsien-Ming Lee
(74) *Attorney, Agent, or Firm*—Sughrue, Mion, Zinn, Macpeak & Seas, PLLC

(57) ABSTRACT

The present invention relates to a nonvolatile semiconductor memory device; which contains, in a memory cell, a memory transistor having a floating gate that is set over a tunnel insulating film on a semiconductor substrate, and a control gate that is set over an interlayer insulating film on this floating gate; and a select transistor having a select gate that is set over a gate insulating film on the semiconductor substrate; wherein the thickness of the gate insulating film in the above-mentioned select transistor is less than the thickness of the tunnel insulating film in the above-mentioned memory transistor. The present invention can provide a nonvolatile semiconductor memory device capable to operate at a high speed with a good stability.

12 Claims, 9 Drawing Sheets

NONVOLATILE SEMICONDUCTOR MEMORY DEVICE AND MANUFACTURING METHOD THEREOF

BACKGROUND OF THE INVENTION

1. Field of the Invention

The present invention relates to a nonvolatile semiconductor memory device and a manufacturing method thereof and more particularly to a nonvolatile semiconductor memory device a memory cell of which contains a memory transistor and a select transistor and a manufacturing method thereof.

2. Description of the Related Art

Flash memories that are nonvolatile semiconductor memory devices can be divided into two groups. One is flash memories comprising solely 1-Tr type transistors (FIG. 4A) wherein only one transistor is contained in each memory cell, and the other, flash memories comprising 2-Tr type transistors (FIG. 4B) wherein two transistors, a memory transistor and a select transistor, are contained in each memory cell.

While a flash memory comprising solely 1-Tr type transistors (referred to as 'a 1-Tr type flash memory', hereinafter) is used, if anything, with the object of reducing a cell area and attaining a high density, a flash memory comprising 2-Tr type transistors (referred to as 'a 2-Tr type flash memory', hereinafter) is often used for the purpose of achieving high-speed reading, especially where is embedded in high-speed logic devices.

The 2-Tr type flash memory contains two sorts of transistors, a memory transistor having a floating gate electrode (FG) and a control gate electrode (CG) and a select transistor. The memory transistor functions as a memory through changing the threshold value of the memory transistor, which is brought about by injection and extraction of electrons over the FG.

Since the precise adjustment of the threshold value for a transistor is generally difficult to achieve, even with the verification performed, the variation of the threshold values is often larger than 0.5 V.

In a 1-Tr type flash memory comprising only 1-Tr type transistors and, thus, containing memory transistors alone, enhancement type transistors cannot be employed as memory transistors, if the on-off characteristic is to be maintained. Therefore, with such a variation of the threshold values present, reading must be performed by transistors some of which have high threshold values or slow operational speeds so that the reading speed of the flash memory becomes considerably slow.

As against this, in the case of a 2-Tr type flash memory, even though memory transistors become enhancement type transistors by extraction of electrons out of the FGs, select transistors can serve as switches, and the on-off characteristic of the flash memory can be secured. Because the standard MOSFETs (Metal-Oxide-Semiconductor Field Effect Transistor) are used as select transistors, the variation of the threshold values thereof can be kept small, and a high and stable reading speed of the flash memory can be readily obtained.

Now, referring to the drawings, a conventional method of manufacturing a 2-Tr type flash memory is described below. FIGS. 3A–3J are schematic cross-sectional views of a semiconductor memory device illustrating, in sequence, the steps of the conventional method.

Firstly, upon a P-type semiconductor substrate 1, a P-well is formed by means of ion implantation and heat treatment.

Next, after forming field oxide films 2 in the element isolation regions, a tunnel oxide film 3 is formed to a thickness of 8–10 nm over the surface of the substrate by the thermal oxidation method. This tunnel oxide film constitutes a memory transistor and, at the same time, as a gate oxide film, constitutes a select transistor. Over this film, a first polysilicon 4 that is to serve as a FG is formed to a thickness of 150 nm. Phosphorus is, then, implanted into the first polysilicon 4, which forms an N-type polysilicon (FIG. 3A).

Next, a resist is formed into a pattern in the prescribed region (FIG. 3B), and, using this as a mask, the first polysilicon 4 is etched (FIG. 3C).

Next, by the CVD (Chemical Vapour Deposition) method, an ONO (Oxide-Nitride-Oxide) film 6 is formed over the entire surface of the substrate, to a thickness of 12–16 nm in the terms of oxide film thickness. Further, over this, a second polysilicon 7 is grown to a thickness of 200 nm by the CVD method (FIG. 3D).

Next, in order to form-both gate electrodes of a memory transistor and a select transistor, a resist 8 is formed into patterns (FIG. 3E), and, using the resist 8 as a mask, etching is applied thereto (FIG. 3F).

Next, arsenic or phosphorus is ion implanted thereinto with a dose of 1E 13–14 $cm^{-2}$, which forms LDD (Lightly-Doped Drain) regions 9 (FIG. 3G).

Subsequently, an oxide film 10 is grown over the entire surface (FIG. 3H) and, through etch back, sidewalls 11 are formed (FIG. 3I).

Arsenic is, then, ion implanted thereinto with a dose of 1–5 E 15 $cm^{-2}$, which forms source-drain regions 12 (FIG. 3J).

The reading speed of the 2-Tr type flash memory is determined by the operational speed of the select transistors therein. Therefore, in order to attain high reading speed, the operational speed of the select transistors must be set high.

In the conventional manufacturing method, however, as the gate oxide film of the select transistor is simultaneously formed with the tunnel oxide film of the memory transistor, the operational speed of the select transistor cannot be designed independently without affecting the memory transistor. As a result, an advantage of high reading speed that the 2-Tr type flash memory possesses in comparison with the 1-Tr type flash memory cannot be, hitherto, exploited to the full.

SUMMARY OF THE INVENTION

An object of the present invention is to provide a manufacturing method that allows the operational speed of the select transistor to be designed separately from the memory transistor. Further, another object of.the present invention is to provide a nonvolatile semiconductor memory device capable to operate at a high speed with a good stability.

The present invention relates to a nonvolatile semiconductor memory device; which contains, in a memory cell,

- a memory transistor having a floating gate that is set over a tunnel insulating film on a semiconductor substrate, and a control gate that is set over an interlayer insulating film on said floating gate; and
- a select transistor having a select gate that is set over a gate insulating film on the semiconductor substrate; wherein:
- the thickness of the gate insulating film in said select transistor is less than the thickness of the tunnel insulating film in said memory transistor.

Further, the present invention relates to a method of manufacturing a nonvolatile semiconductor memory device; which contains, in a memory cell, a memory transistor having a floating gate that is set over a tunnel insulating film on a semiconductor substrate, and a control gate that is set over an interlayer insulating film on said floating gate; and a select transistor having a select gate that is set over a gate insulating film on the semiconductor substrate; which comprises the steps of:

forming, on the semiconductor substrate, a first insulating film for formation of the tunnel insulating film;

forming, on the first insulating film, a first polysilicon layer for formation of the floating gate, and, then, patterning the first polysilicon layer as well as the first insulating film;

forming a second insulating film for formation of said gate insulating film so that the second insulating film may be thinner than the first insulating film;

forming a second polysilicon layer for formation of the select gate so as to fill up the space between patterns of the first polysilicon layer;

exposing the first polysilicon layer, and thereafter forming a third insulating film for formation of said interlayer insulating film;

forming a third polysilicon layer for formation of the control gate; and forming a floating gate, an interlayer insulating film and a control gate of the memory transistor as well as a select gate of the select transistor by patterning.

Further, the present invention relates to the method of manufacturing a nonvolatile semiconductor memory device as set forth above; wherein, in the step of forming a second polysilicon layer for formation of the select gate, the second polysilicon layer is formed to fill up the space between patterns of the first polysilicon layer and, in addition, to cover the first polysilicon layer; and wherein said step of exposing the first polysilicon layer, prior to forming a third insulating film for formation of said interlayer insulating film, comprises the steps of:

performing chemical mechanical polishing till the second insulating film lying on the first polysilicon layer is exposed; and removing the second insulating film lying on the first polysilicon layer by etching so as to expose the first polysilicon layer.

The present invention can provide a flash memory capable to operate at a high speed with a good stability and to perform stable high-speed readings. The present structure being taken, an advantage of high reading speed that the 2-Tr type flash memory possesses in comparison with the 1-Tr type flash memory can be exploited to the full.

Further, the manufacturing method of the present invention allows the operational speed of the select transistor to be designed separately from the memory transistor, and, as a result, this method can produce a flash memory capable to operate at a high speed with a good stability.

DETAILED DESCRIPTION OF THE PREFERRED EMBODIMENTS

Referring to the preferred embodiments, the present invention is described below.

Figure 1:
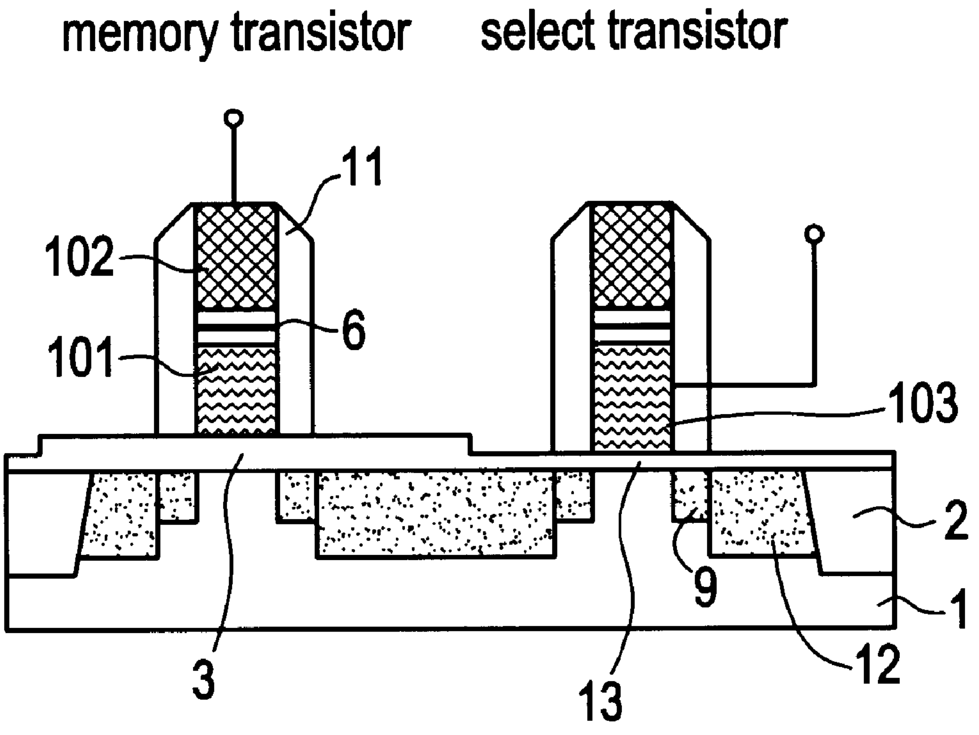
FIG. 1 is a schematic cross-sectional view showing a nonvolatile semiconductor memory device in accordance with the present invention.

FIG. 1 is a schematic cross-sectional view showing the structure of a memory cell section of a flash memory in accordance with the present invention. As for referential numerals in the drawings, 1 denotes a semiconductor substrate; 2, a field oxide film; 9, a LDD region; 12, a source-drain region; 3, a tunnel insulating film made of a thermal oxidation film; 101, a floating gate (FG) made of polysilicon; 6, an interlayer insulating film made of an ONO film; 102, a control gate (CG) made of polysilicon; 13, a gate insulating film made of a thermal oxidation film; and 103, a select gate made of polysilicon.

The main feature characterizing the flash memory of the present invention is that the thickness of the gate insulating film 13 is less than that of the tunnel insulating film 3. With such a structure, the gate length of the select transistor can be shortened, according to the scaling law, and, therefore, the cell size, that has been, to date, a weak point for the 2-Tr type flash memory, can be well reduced. Further, as the driving force of the select transistor goes up, stable operational speed and high-speed operation become attainable.

Hereat, it is preferable that the dopant concentration of the floating gate is lower than the dopant concentration of the select gate, and it is more preferable that the dopant concentration of the floating gate is not greater than 1E 20 $cm^{-3}$ and the dopant concentration of the select gate is not less than 1E 20 $cm^{-3}$.

Referring to the drawings, a manufacturing method of a flash memory of the present invention is described below.

FIGS. 2A–2M are a series of schematic cross-sectional views of a semiconductor device illustrating, in sequence, the steps of a manufacturing method that is an example of the present invention.

Figure 2A:
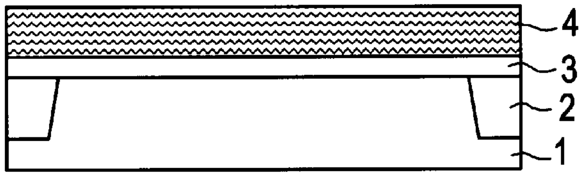
FIGS. 2A–2N are a series of schematic cross-sectional views illustrating, in sequence, the steps of a method of manufacturing a nonvolatile semiconductor memory device in accordance with the present invention.

Firstly, upon a P-type semiconductor substrate 1, a P-well is formed by means of ion implantation and heat treatment. Next, after forming field oxide films 2 in the element isolation regions, a tunnel oxide film 3 is formed to a thickness of 8–10 nm over the surface of the substrate by the thermal oxidation method. Over this film, a first polysilicon 4 for formation of the floating gate electrode (FG) is formed to a thickness of 150 nm. Phosphorus is, then, implanted into the first polysilicon 4, which forms an N-type polysilicon (FIG. 2A).

Figure 2B:
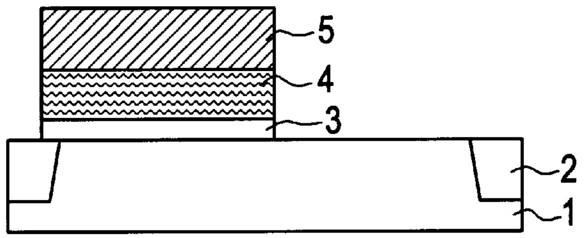

Next, a resist 5 is formed into a pattern in the memory transistor region, and, using this as a mask, the first polysilicon 4 and the tunnel oxide film 3 are removed by etching (FIG. 2B).

Figure 2C:
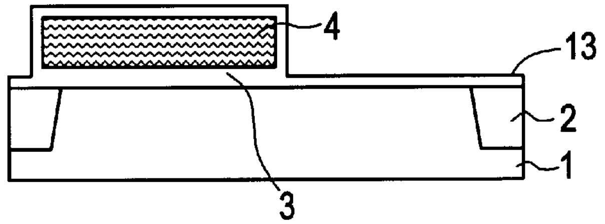
Figure 2D:
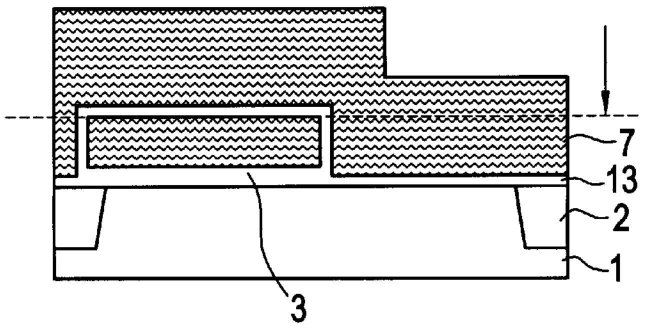

Next, after removing the resist 5, a gate oxide film with a thickness of 1.5–6.0 nm or so, which is less than the thickness of the tunnel oxide film, is formed in the select transistor region by the thermal oxidation method. Also, the surface of the FG is oxidized thereat (FIG. 2C). In the present embodiment, the thickness of the gate oxide film is set to be 5 nm. The thicknesses of the tunnel oxide film 3 and the gate oxide film 13 are set in such a way that the threshold value of said memory transistor becomes less than the threshold value of said select transistor.

Figure 2E:
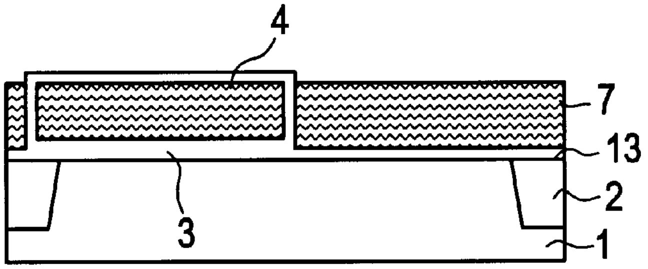
Figure 2F:
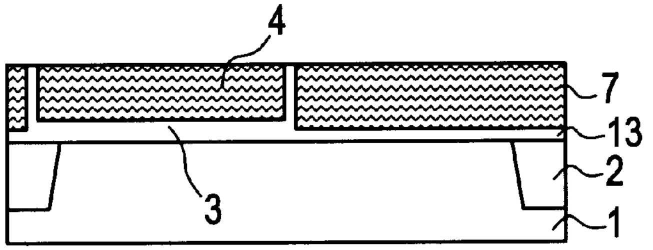

Next, a second polysilicon 7 for formation of the select gate is grown to a thickness of 200 nm by the CVD method, and, then, the second polysilicon 7 is polished by the CMP (Chemical Mechanical Polishing) method till the oxide film lying on the surface of the first polysilicon is exposed, as shown in FIG. 2E. Further, the oxide film lying on the surface of the first polysilicon is removed by wet etch (FIG. 2F). In other words, with reference to FIG. 2D, the CMP is carried out in the direction of the arrow and, then, with the subsequent etching, the polysilicon and the oxide film are removed, in the end, down to the level indicated by a dotted line.

Figure 2G:
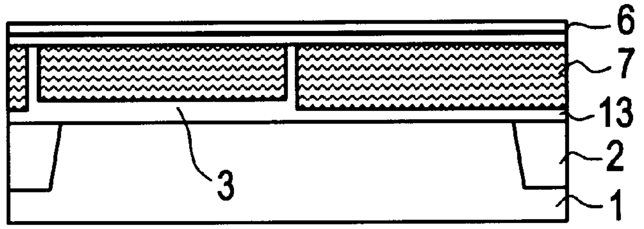
Figure 2H:
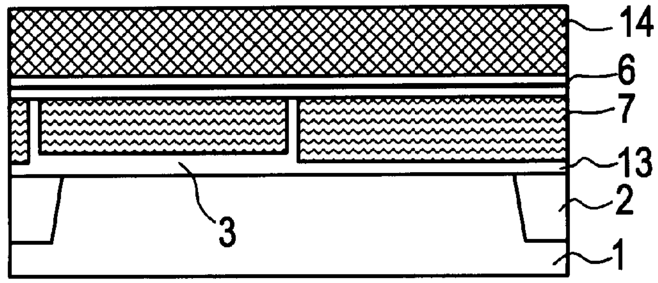
Figure 2I:
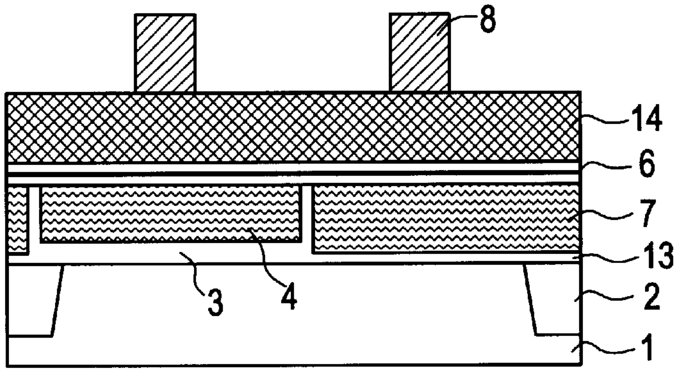

Next, by the CVD method, an ONO film 6 is formed over the entire surface of the substrate, to a thickness of 12–16 nm in the terms of oxide film thickness (FIG. 2G). Further, over this, a third polysilicon 14 for formation of the control gate is grown to a thickness of 200 nm by the CVD method (FIG. 2H).

Figure 2J:
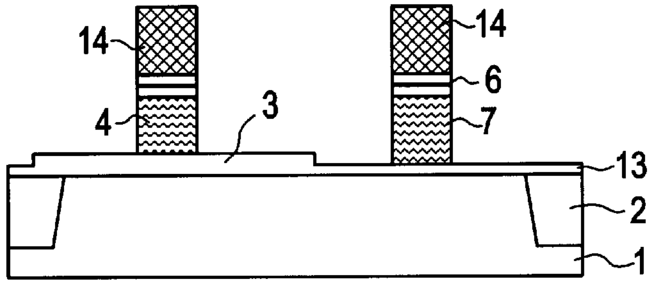

Next, in order to form both gate electrodes of a memory transistor and a select transistor, a resist 8 is formed into patterns (FIG. 2I), and, using the resist 8 as a mask,. etching is applied thereto (FIG. 2J). This accomplishes a floating gate 101, an interlayer insulating film 6 made of an ONO film and a control gate 102 of the memory transistor as well as a select gate 103 of the select transistor, as shown in FIG. 1.

Figure 2K:
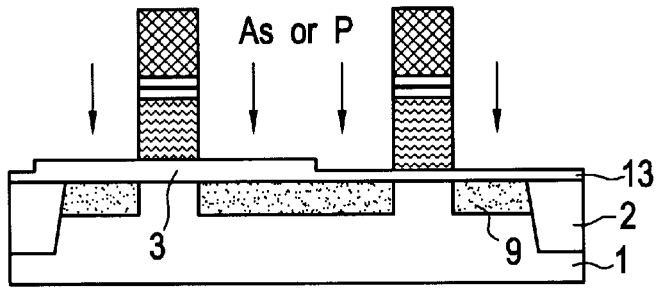
Figure 2L:
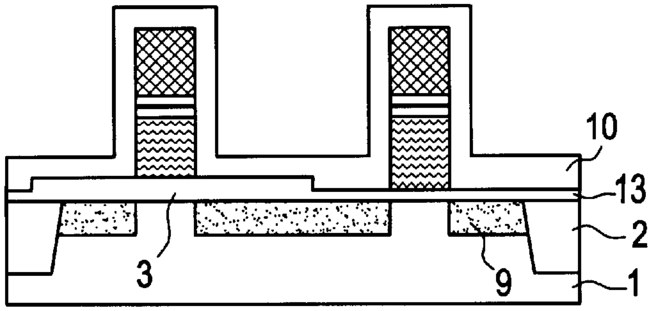

Next, arsenic or phosphorus is ion implanted thereinto with a dose of 1E 13–14 $cm^{-2}$, which forms LDD regions 9 (FIG. 2K).

Figure 2M:
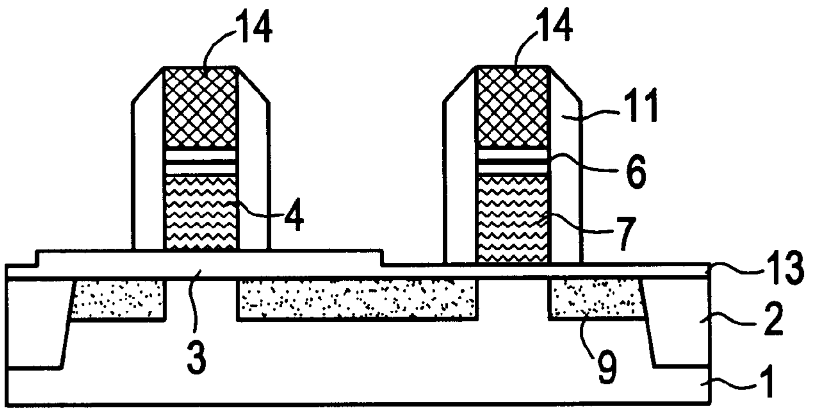

Subsequently, an oxide film 10 for formation of the sidewalls is grown over the entire surface (FIG. 2L) and, through etch back, sidewalls 11 are formed (FIG. 2M).

Figure 2N:
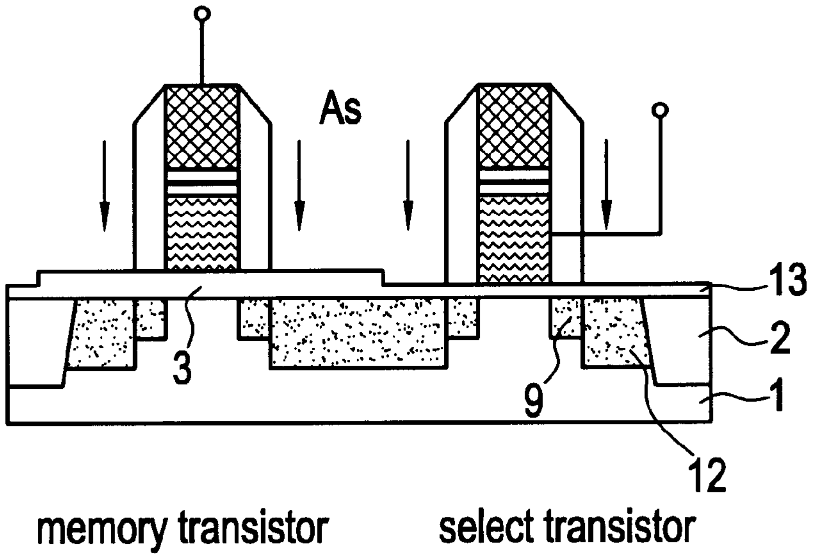
Figure 3A:
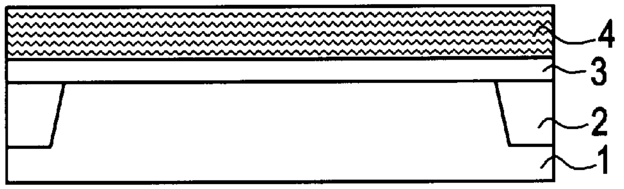
FIGS. 3A–3J are a series of schematic cross-sectional views illustrating, in sequence, the steps of a conventional method of manufacturing a nonvolatile semiconductor memory device.
Figure 3B:
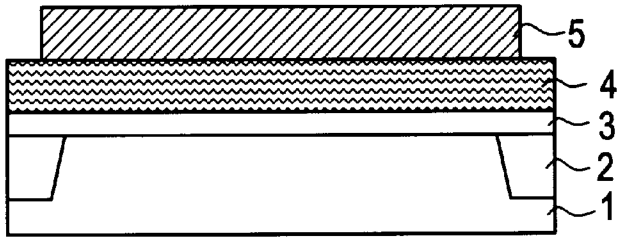
Figure 3C:
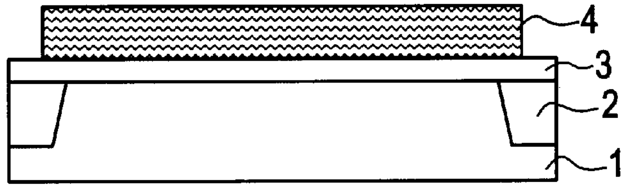
Figure 3D:
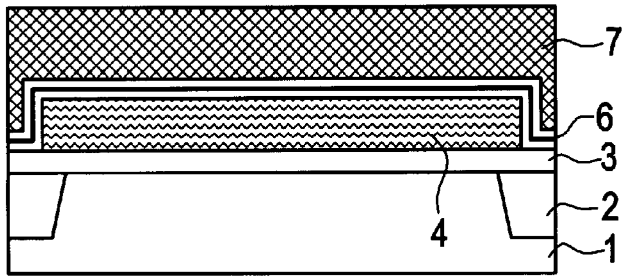
Figure 3E:
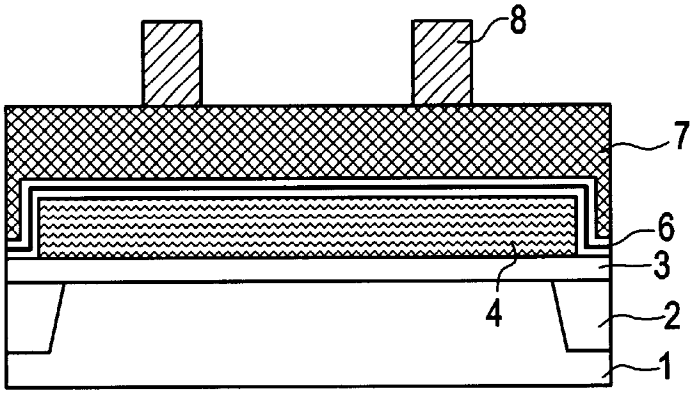
Figure 3F:
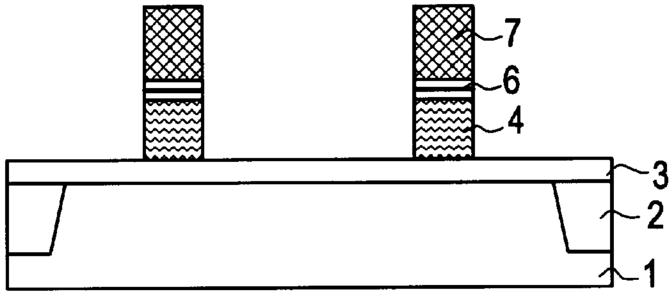
Figure 3G:
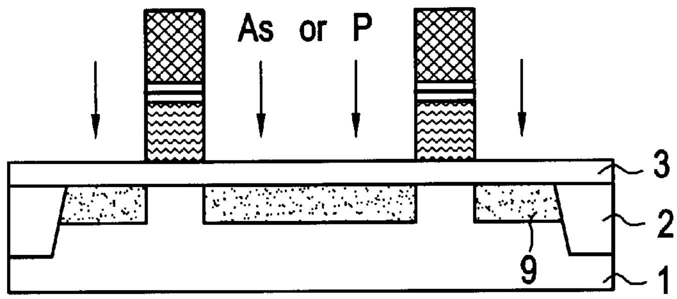
Figure 3H:
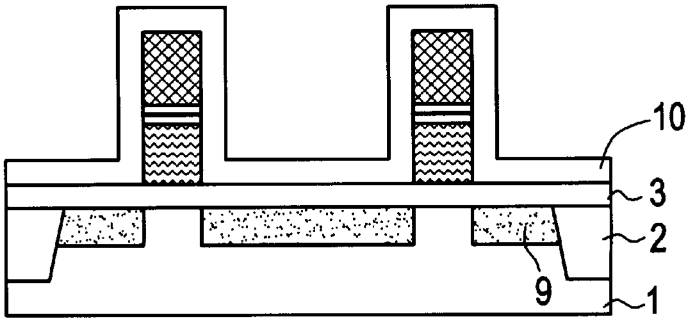
Figure 3I:
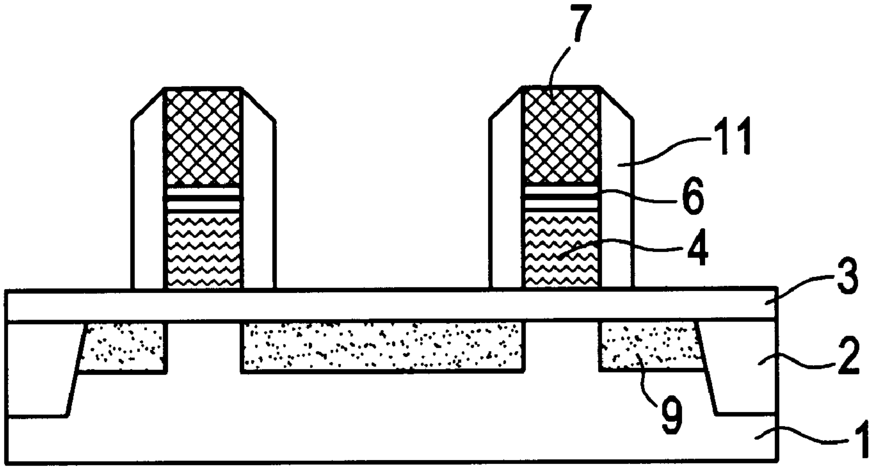
Figure 3J:
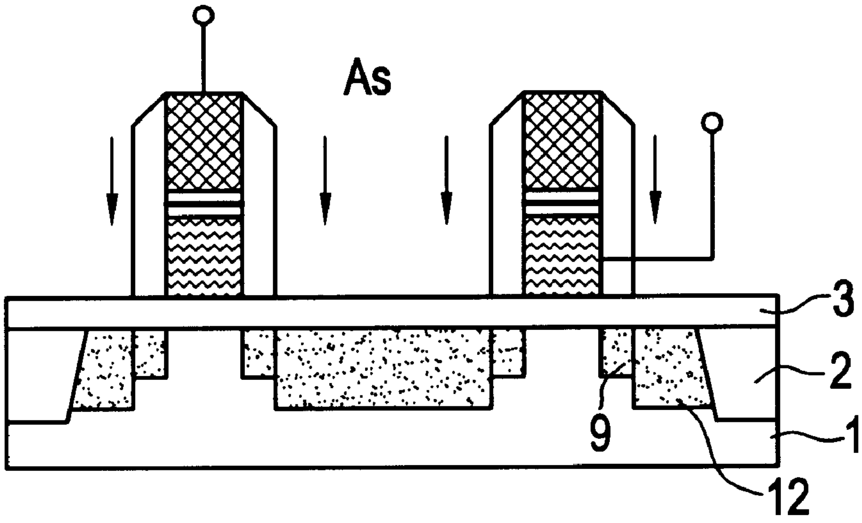
Figure 4A:
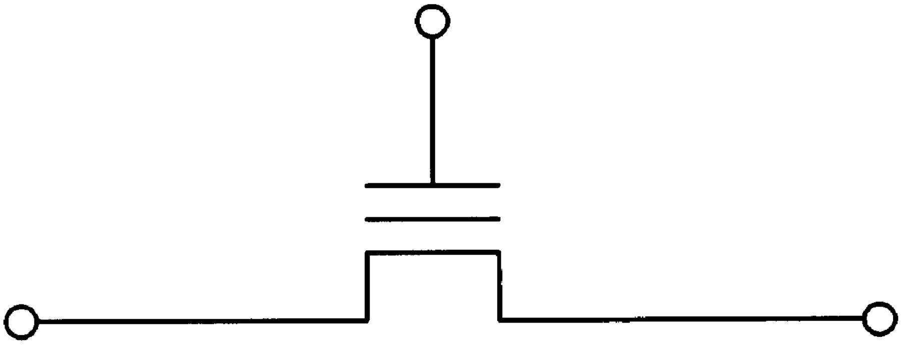
FIGS. 4A–4B is a diagram of transistor arrangements for a nonvolatile semiconductor memory device, shown with symbols.
Figure 4B:
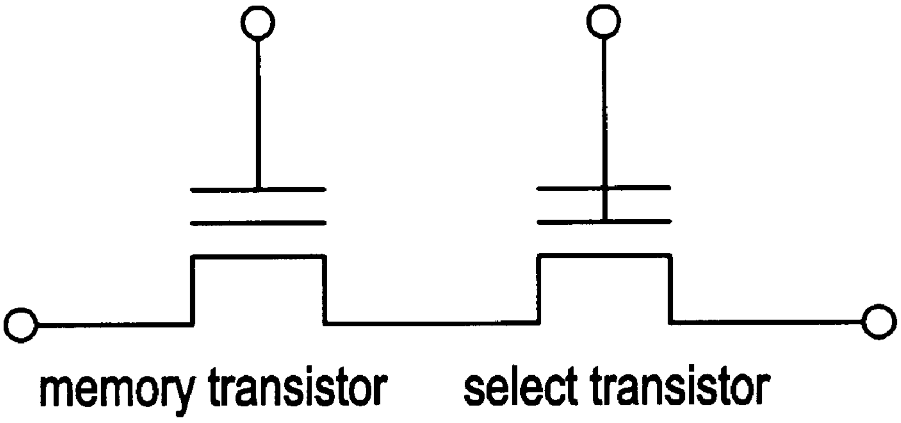

Arsenic is, then, ion implanted thereinto with a dose of 1–5 E 15 $cm^{-2}$, which forms source-drain regions 12 (FIG. 2N).

The manufacturing method of the present invention can make the thickness of the gate insulating film 13 thinner than that of the tunnel insulating film 3, and besides, this method can set the dopant concentration of the first polysilicon 4 constituting the FG of the memory transistor and the dopant concentration of the second polysilicon 7 constituting the gate electrode of the select transistor independently from each other.

In general, when the dopant concentration of the first polysilicon 4 constituting the FG of the memory transistor is too high, the hold characteristics of the flash memory deteriorate. On the other hand, when the dopant concentration of the second polysilicon 7 constituting the gate electrode of the select transistor is too low, and especially if the gate oxide film is thin, the depletion of the gate, by comparison, increases the relative significance so that there arises a problem that the virtual thickness of the gate oxide film becomes increased. In effect, the dopant concentrations of the first polysilicon 4 and the second polysilicon 7 have respective optimum ranges. As the present invention allows these dopant concentrations to be set independently, both dopant concentrations can be set within their own optimum ranges. In the present embodiment, the dopant concentration of the first polysilicon 4 is preferably not greater than 1E 20 $cm^{-3}$, and the dopant concentration of the second polysilicon 7 is preferably not less than 1E 20 $cm^{-3}$.

What is claimed is:

1. A nonvolatile semiconductor memory device; which contains, in a memory cell, a memory transistor having a floating gate that is set over a tunnel insulating film on a semiconductor substrate, and a control gate that is set over an interlayer insulating film on said floating gate; and a select transistor having a select gate that is set over a gate insulating film on the semiconductor substrate; wherein:

the thickness of the gate insulating film in said select transistor is less than the thickness of the tunnel insulating film in said memory transistor.

2. The nonvolatile semiconductor memory device according to claim 1, wherein the dopant concentration of said floating gate is lower than the dopant concentration of said select gate.

3. The nonvolatile semiconductor memory device according to claim 2, wherein the dopant concentration of said floating gate is not higher than 1E 20 $cm^{-3}$ and the dopant concentration of said select gate is higher than 1E 20 $cm^{-3}$.

4. The nonvolatile semiconductor memory device according to claim 1, wherein said tunnel insulating film and said gate insulating film are both thermal oxidation films.

5. The nonvolatile semiconductor memory device according to claim 1, wherein said interlayer insulating film is an ONO film.

6. A method of manufacturing a nonvolatile semiconductor memory device; which contains, in a memory cell, a memory transistor having a floating gate that is set over a tunnel insulating film on a semiconductor substrate, and a control gate that is set over an interlayer insulating film on said floating gate; and a select transistor having a select gate that is set over a gate insulating film on the semiconductor substrate; which comprises the steps of:

forming, on the semiconductor substrate, a first insulating film for formation of the tunnel insulating film;

forming, on the first insulating film, a first polysilicon layer for formation of the floating gate, and, then, patterning the first polysilicon layer as well as the first insulating film;

forming a second insulating film for formation of said gate insulating film so that the second insulating film may be thinner than the first insulating film;

forming a second polysilicon layer for formation of the select gate so as to fill up the space between patterns of the first polysilicon layer;

exposing the first polysilicon layer, and thereafter forming a third insulating film for formation of said interlayer insulating film;

forming a third polysilicon layer for formation of the control gate; and forming a floating gate, an interlayer insulating film and a control gate of the memory transistor as well as a select gate of the select transistor by patterning.

7. The method of manufacturing a nonvolatile semiconductor memory device according to claim 6; wherein:

in the step of forming a second polysilicon layer for formation of the select gate, the second polysilicon layer is formed to fill up the space between patterns of the first polysilicon layer and, in addition, to cover the first polysilicon layer; and wherein said step of exposing the first polysilicon layer, prior to forming a third insulating film for formation of said interlayer insulating film, comprises the steps of:

performing chemical mechanical polishing till the second insulating film lying on the first polysilicon layer is exposed; and removing the second insulating film lying on the first polysilicon layer by etching so as to expose the first polysilicon layer.

8. The method of manufacturing a nonvolatile semiconductor memory device according to claim 6, wherein the thicknesses of the first insulating film and the second insulating film are set in such a way that the threshold value of said memory transistor becomes smaller than the threshold value of said select transistor.

9. The method of manufacturing a nonvolatile semiconductor memory device according to claim 6, wherein the dopant concentration of the first polysilicon layer and the dopant concentration of the second polysilicon layer are set independently.

10. The method of manufacturing a nonvolatile semiconductor memory device according to claim 6, wherein the dopant concentration of the first polysilicon layer is not higher than 1E 20 $cm^{-3}$ and the dopant concentration of the second polysilicon layer is higher than 1E 20 $cm^{-3}$, both of the concentrations being set independently.

11. The method of manufacturing a nonvolatile semiconductor memory device according to claim 6, wherein said first insulating film and said second insulating film are both formed by means of thermal oxidation.

12. The method of manufacturing a nonvolatile semiconductor memory device according to claim 6, wherein said third insulating film is an ONO film.

* * * * *